(12) United States Patent
Fiolka

(10) Patent No.: US 8,040,492 B2
(45) Date of Patent: Oct. 18, 2011

(54) ILLUMINATION SYSTEM OF A MICROLITHOGRAPHIC PROJECTION EXPOSURE APPARATUS

(75) Inventor: Damian Fiolka, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 427 days.

(21) Appl. No.: 12/270,994

(22) Filed: Nov. 14, 2008

(65) Prior Publication Data

US 2009/0135397 A1 May 28, 2009

Related U.S. Application Data

(60) Provisional application No. 60/990,355, filed on Nov. 27, 2007.

(30) Foreign Application Priority Data

Nov. 27, 2007 (DE) .................. 10 2007 057 387

(51) Int. Cl.
G03B 27/54 (2006.01)
G03B 27/72 (2006.01)

(52) U.S. Cl. ........................... 355/67; 355/71
(58) Field of Classification Search .............. 355/71, 355/67
See application file for complete search history.

(56) References Cited

U.S. PATENT DOCUMENTS

| 6,958,806 B2 * | 10/2005 | Mulder et al. .................. 355/68 |
| 2001/0052968 A1 | 12/2001 | Shiozawa |
| 2006/0055834 A1 | 3/2006 | Tanitsu et al. |
| 2006/0077373 A1 * | 4/2006 | Mulkens et al. ............... 355/71 |
| 2007/0146676 A1 | 6/2007 | Tanitsu et al. |
| 2007/0165202 A1 | 7/2007 | Koehler et al. |
| 2008/0218725 A1 | 9/2008 | Fiolka |
| 2009/0135397 A1 * | 5/2009 | Fiolka ............................ 355/71 |

FOREIGN PATENT DOCUMENTS

| DE | 103 43 333 | 4/2005 |
| DE | 10 2007 055 408 | 5/2008 |
| WO | WO 2005/026843 | 3/2005 |
| WO | WO 2005/069081 | 7/2005 |
| WO | WO 2007/039519 | 4/2007 |

* cited by examiner

*Primary Examiner* — Hung Henry Nguyen
*Assistant Examiner* — Michelle Iacoletti
(74) *Attorney, Agent, or Firm* — Fish & Richardson P.C.

(57) ABSTRACT

An illumination system of a microlithographic projection exposure apparatus, as well as related systems, methods and components are disclosed. The illumination system can include a polarization manipulator configured to variably adjust a change in the polarization state of light impinging thereon. The illumination system can also include a mirror arrangement having a plurality of mirror elements that are displaceable independently of each other to alter an angle distribution of the light reflected by the mirror arrangement. A change in the intensity distribution caused by the polarization manipulator in a plane of the projection exposure apparatus can be at least partially compensated by the mirror arrangement.

20 Claims, 14 Drawing Sheets

ILLUMINATION SYSTEM OF A MICROLITHOGRAPHIC PROJECTION EXPOSURE APPARATUS

CROSS-REFERENCE TO RELATED APPLICATION

This application claims priority under 35 U.S.C. §119(e)(1) to U.S. Provisional Application No. 60/990,355 filed Nov. 27, 2007. This applications also claims priority under 35 U.S.C. §119 to German Patent Application DE 10 2007 057 387.3, filed Nov. 27, 2007. The contents of both of these applications are hereby incorporated by reference.

FIELD

The disclosure relates to an illumination system of a microlithographic projection exposure apparatus, as well as related systems, methods and components.

BACKGROUND

Microlithography can be used for the production of microstructured components such as, for example, integrated circuits or LCDs. The microlithography process is typically carried out in what is referred to as a projection exposure apparatus having an illumination system and a projection objective. The image of a mask illuminated by the illumination system (reticle) is projected by the projection objective onto a substrate (for example a silicon wafer) which is coated with a light-sensitive layer (photoresist) and arranged in the image plane of the projection objective in order to transfer the mask structure onto the light-sensitive coating on the substrate.

SUMMARY

In some embodiments, the disclosure provides an illumination system of a microlithographic projection exposure apparatus which has enhanced flexibility with respect to the intensity and polarization distributions which can be adjusted in the projection exposure apparatus.

In certain embodiments, an illumination system of a microlithographic projection exposure apparatus includes a polarization manipulator that causes a variably adjustable change in the polarization state of light impinging thereon. The illumination system also includes a mirror arrangement having a plurality of mirror elements that are displaceable independently of each other to alter an angle distribution of the light reflected by the mirror arrangement. A change in the intensity distribution caused by the polarization manipulator in a plane of the projection exposure apparatus can be at least partially compensated by the mirror arrangement.

The disclosure is based, at least in part, on the concept that a change in the intensity distribution relating to manipulation of the polarization distribution in the illumination system by a polarization manipulator can be at least partially compensated by using a mirror arrangement including a plurality of micromirrors in a plane of the projection exposure apparatus (e.g., the reticle plane or the wafer plane) to adjust the intensity distribution in compensatory fashion. It can therefore be possible to avoid implementing a change between a plurality of different diffractive elements (DOEs) for a variation in intensity distribution, thereby allowing for a relatively simple handling procedure to vary the light distribution.

In some embodiments, the mirror arrangement can provide a high level of flexibility with respect to light distribution produced by the illumination system in the projection exposure apparatus. An influence on light or intensity distribution, which is caused by the polarization manipulator, can be at least partially compensated by using the degree of freedom additionally afforded by the possibility of flexible adjustment of the micromirrors of the mirror arrangement.

In certain embodiments, the illumination system further includes a microlens arrangement with a plurality of microlenses. Such a microlens arrangement can provide for specifically targeted focusing onto the individual mirror elements of the mirror arrangement and it is thus possible to reduce or eliminate lighting up a "dead area".

In some embodiments, the illumination system further includes an intensity measuring device to measure the intensity in a plane of the projection exposure apparatus.

In certain embodiments, there is also provided a temperature measuring device to measure temperature at the polarization manipulator. That can make it possible to take account of a temperature sensitivity of the polarization action which is adjustable by the polarization manipulator.

In some embodiments, the illumination system further includes a control device to actuate the mirror arrangement depending on an output signal of an intensity measuring device and/or a temperature measuring device.

In certain embodiments, the illumination system has exclusively the mirror arrangement as the device to produce an annular intensity distribution. In such embodiments, it is thus possible to avoid using an additional axicon module.

In some embodiments, the polarization manipulator is arranged in a pupil plane of the illumination system.

In certain embodiments, the polarization manipulator has at least two subelements which are arranged movably relative to each other.

In some embodiments, the polarization manipulator has a plurality of polarization rotators which cause a rotation of the polarization direction through a variably adjustable rotational angle for respective impinging linearly polarized light.

In certain embodiments, each of the polarization rotators has a pair of deflection prisms which are movable relative to each other.

In some embodiments, the illumination system has an optical axis, and the polarization rotators are arranged along the circumference of a circle so that the optical axis extends through the center point of the circle.

In certain embodiments, the arrangement of the polarization rotators is interrupted along the circumference of the circle in at least two mutually opposite regions in which none of the polarization rotators is disposed. Such embodiments can simplify the structure of the polarization manipulator and save on material. Such embodiments can make use of the fact that no change in the preferred polarization direction needs to take place in the regions for adjustment of a quasi-tangential polarization distribution in the impingement of correspondingly polarized light.

In some embodiments, the subelements are made from optically active material.

In certain embodiments, the polarization manipulator has both levorotatory optically active material and dextrorotatory optically active material. This can reduce or avoid unwanted temperature influences because the polarization rotation caused by a subelement of dextrorotatory optically active material can be partially or completely compensated by the opposite effect in levorotatory optically active material.

In some embodiments, at least one of the subelements has an opaque edge region on its light entrance surface and/or its light exit surface. In such embodiments, unwanted scatter light can be avoided by masking out an edge region in which the light only passes through one of two subelements of the respective polarization rotator (and which may otherwise not be compensated with respect to its beam deflection by the other sub element).

In certain embodiments, the illumination system further includes a phase manipulator. That phase manipulator can have a plurality of Babinet compensators or a plurality of Soleil compensators.

In some embodiments, a polarization manipulator is arranged upstream of that phase manipulator in the light propagation direction. This can make it possible to specifically target adjustment of the preferred polarization direction relative to the phase manipulator, such as to the crystal axes present in subelements (Babinet compensators or Soleil compensators) of that phase manipulator. This can allow for flexible adjustment of the phase or ellipticity of the polarization state without the subelements of the phase manipulator being rotatable. This can make it is possible to achieve improved and complete pupil filling.

In certain embodiments, the disclosure provides a microlithographic projection exposure apparatus that includes an illumination system as disclosed herein.

In some embodiments, the disclosure provide a process for the microlithographic production of microstructured components using a microlithographic projection exposure apparatus as disclosed herein.

In certain embodiments, the disclosure provides a microstructured component produced using a process disclosed herein.

BRIEF DESCRIPTION OF THE DRAWINGS

The disclosure is described in greater detail hereinafter by exemplary embodiments illustrated in the accompanying drawings in which.

DETAILED DESCRIPTION

Figure 1:
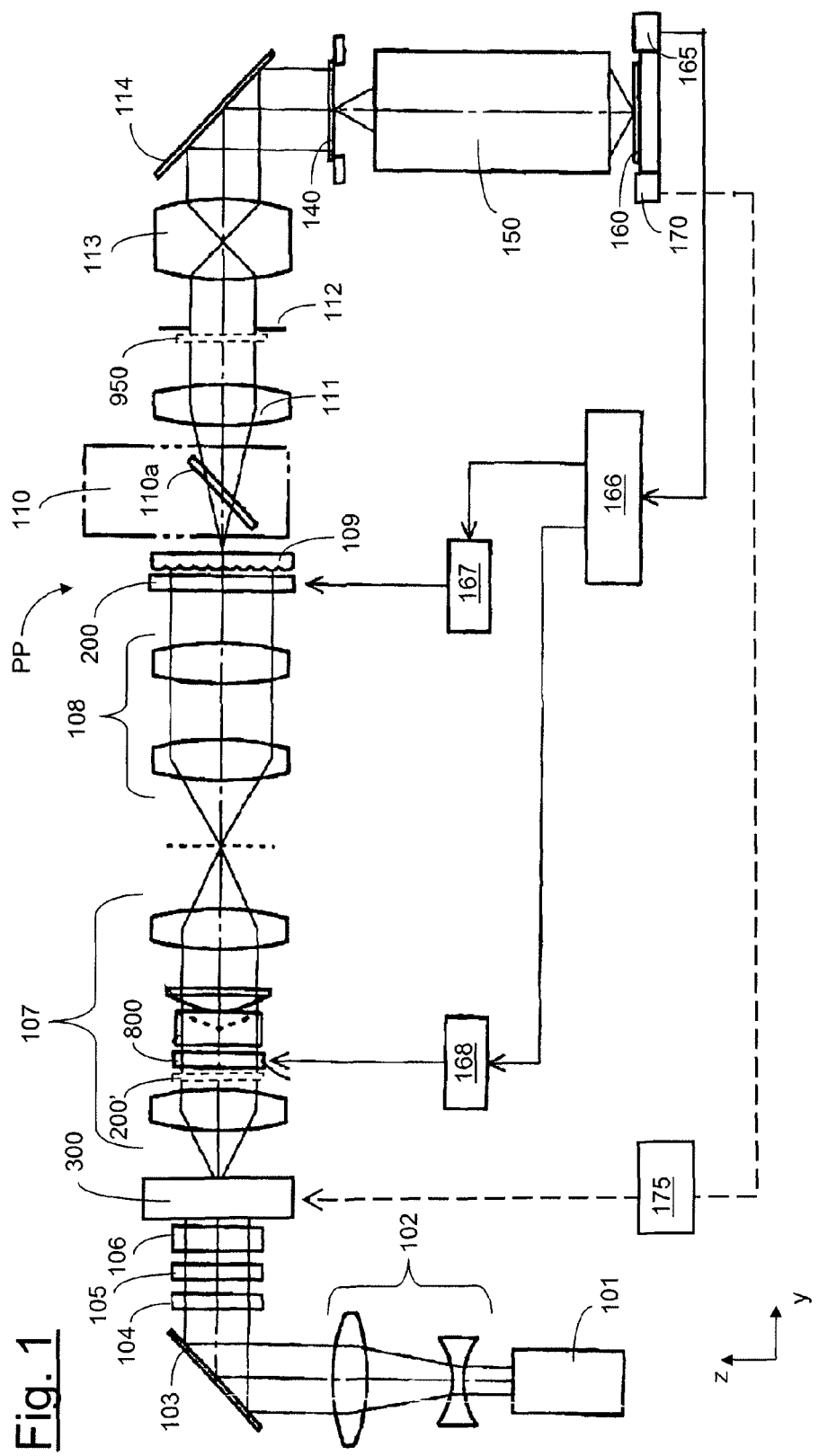
FIG. 1 shows a diagrammatic view of a microlithographic projection exposure apparatus having an illumination system.

FIG. 1 shows a diagrammatic view of a microlithographic projection exposure apparatus with an illumination system.

As described in greater detail hereinafter, the illumination system includes a mirror arrangement 300 having a plurality of mutually independently adjustable micromirrors. A projection exposure apparatus with an illumination system which does not have such a mirror arrangement but instead a diffractive optical element (DOE) is described in US 2007/0146676 A1.

Figure 2A:
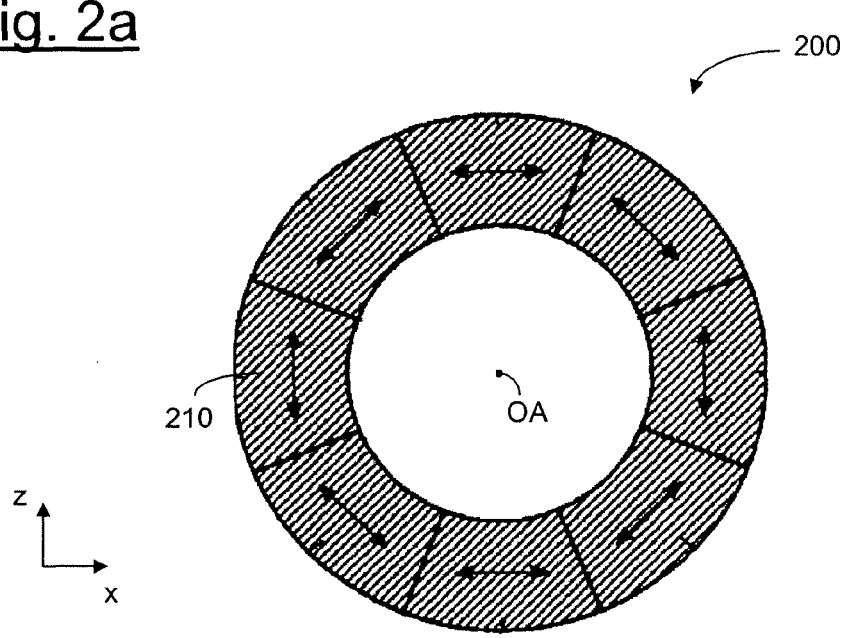
FIGS. 2a-b show views to describe the structure of a polarization manipulator.
Figure 2B:
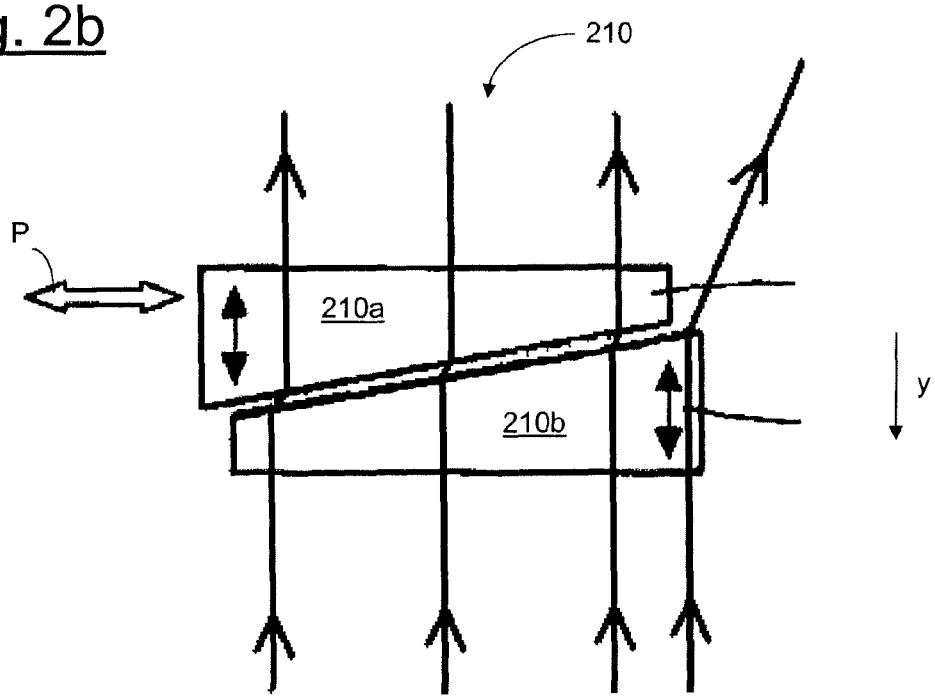

The structure and function of the mirror arrangement 300 are described in detail hereinafter in connection with a polarization manipulator 200 provided in the illumination system. In that respect the configuration of the polarization manipulator 200, shown in FIGS. 2a-b, is also described as such in US 2007/0146676 A1. The subject-matter of the disclosure are however both the use of such a polarization manipulator 200 in connection with the mirror arrangement 300, and also further advantageous configurations of the polarization manipulator.

Referring to FIG. 1 the microlithographic projection exposure apparatus 100 includes an illumination system and a projection objective 150. The illumination system serves for the illumination of a structure-bearing mask (reticle) 140 with light from a light source unit 101 which for example includes an ArF laser for a working wavelength of 193 nm as well as a beam-shaping optical arrangement 102 producing a parallel light beam. The illumination system further includes a deflection mirror 103, a group permitting the polarization state to be shifted, including a lambda/4 plate 104, a lambda/2 plate 105 and a depolarizer 106 and, after the mirror arrangement 300 described in greater detail hereinafter, an optical unit 107 including an axicon lens module as well as a phase manipulator 800 and a zoom unit 108. The phase manipulator 800 is described more fully hereinafter with reference to FIGS. 8a-d. In the light propagation direction, disposed downstream of the polarization manipulator 200 which is also described in fuller detail hereinafter with reference to FIGS. 2a-b, there are a fly-eye lens 109, a unit 110 for monitoring the polarization state with a beam splitter 110a, a convergent lens 111, an aperture unit 112 with subsequent imaging system 113 and a deflection mirror 114, downstream of which there occurs imaging onto the structure-bearing mask (reticle) 140 arranged in a field plane. The image of the structure-bearing mask 140 is formed with the projection objective 150 on a substrate 160 or wafer, provided with a light-sensitive layer.

The projection exposure apparatus 100 further has a measuring device 165 for determining the polarization state of the incoming light in the wafer plane as well as control devices 167 and 168 respectively for actuation of the polarization manipulator 200 and the phase manipulator 800 (which is described in greater detail hereinafter), depending on the polarization state ascertained by the measuring device 165. In addition the projection exposure apparatus 100 has an intensity measuring device 170 to measure the intensity distribution of the incoming light in the wafer plane and a control device 175 to actuate the mirror arrangement 300 depending on the intensity distribution ascertained by the intensity measuring device 170. Alternatively or additionally measurement of the intensity distribution can also be effected in the reticle plane. The intensity measuring device 170 supplies items of information about the light distribution in the pupil plane PP so that the light distribution in the pupil plane PP can be suitably set or re-adjusted by the feedback by way of the control device 175 and the mirror elements 300a, 300b, 300c, of the mirror arrangement 300.

Figure 5:
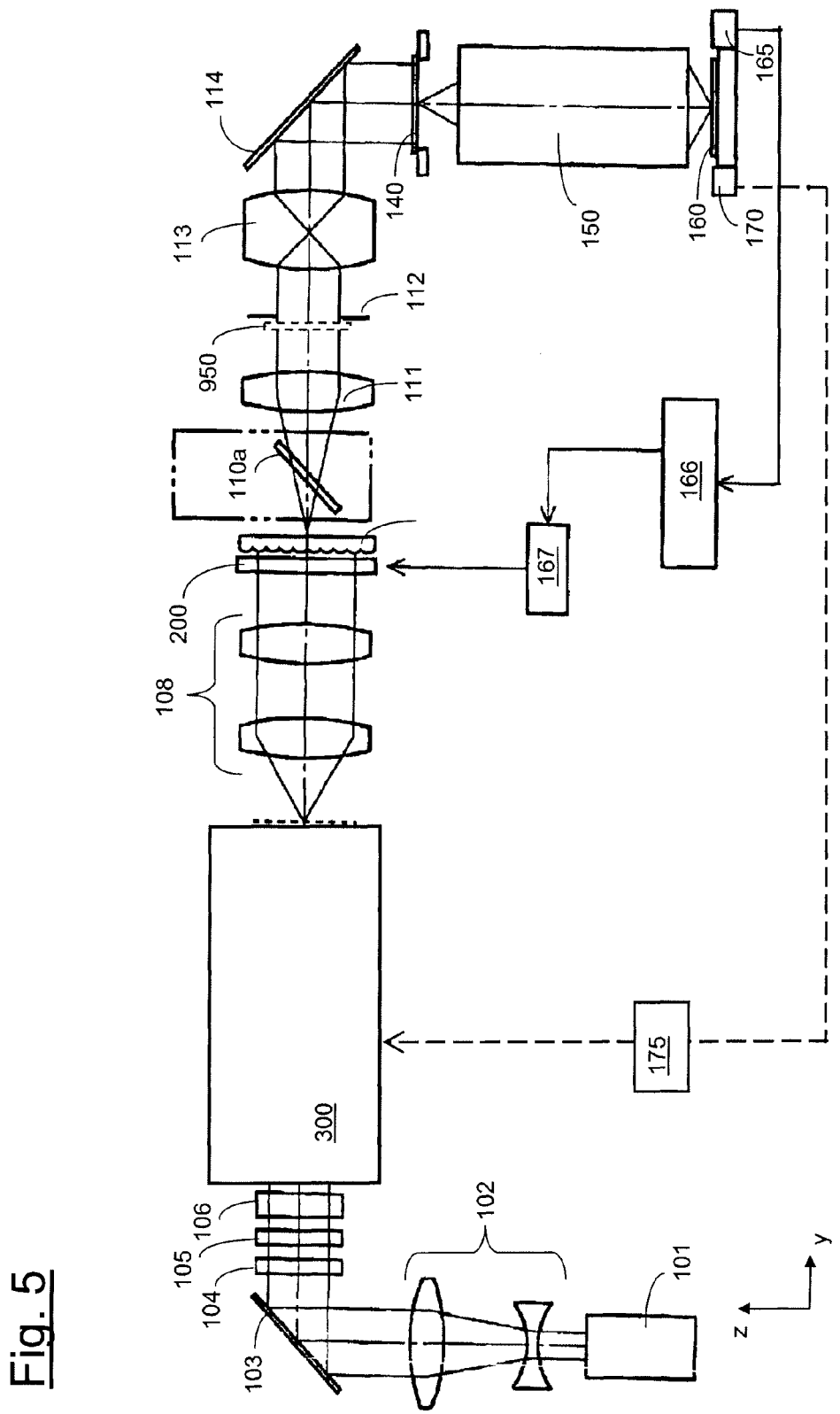

FIG. 5 shows that, by using the mirror arrangement 300, it is also possible to dispense with the optical unit 107 having the axicon lens module (FIG. 5) so that, if desired, it is possible to set an annular light distribution in the pupil plane by the mirror arrangement 300.

Figure 6:
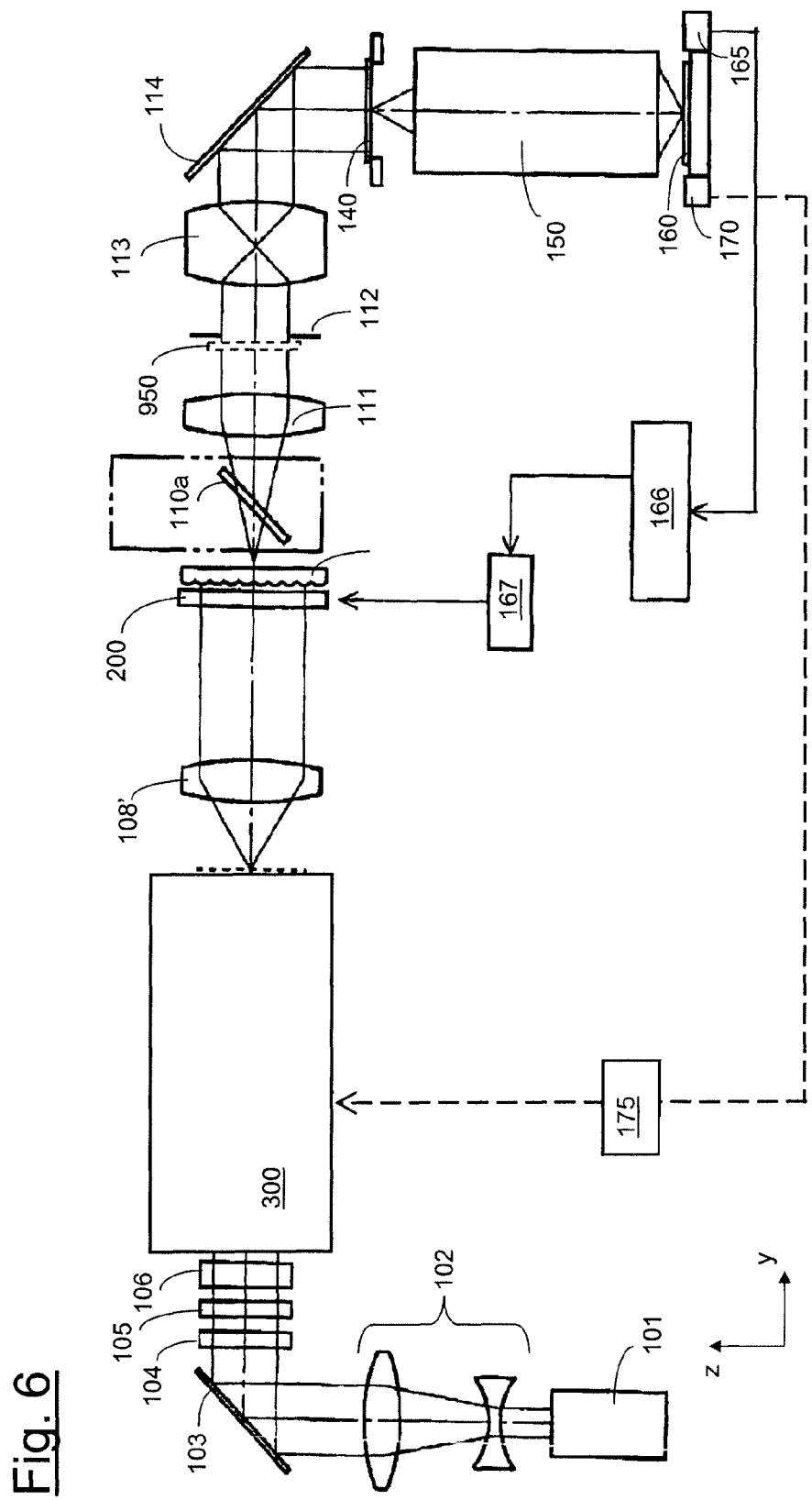

FIG. 6 shows that, by using the mirror arrangement 300, it is possible for the zoom unit 108 to be replaced by a single lens or by an optical unit without a zoom function as that zoom function is dispensable. In some embodiments (not shown), as a consequence of using the mirror arrangement 300, it is also possible only to dispense with the zoom function (that is to say with continuing use of the optical unit 107 of FIG. 1 which has the axicon lens module).

In certain embodiments (not shown), it is also possible to use an integrator bar as a light mixing device, as a modification of the embodiments respectively shown in FIGS. 1, 5 and 6.

Referring to FIGS. 2a-b the polarization manipulator 200 which as shown in FIG. 1 is arranged in a pupil plane PP has a plurality of polarization rotators 210 which effect rotation of the polarization direction through a variably adjustable rotational angle for respective impinging linearly polarized light. Each of those polarization rotators 210 as shown in FIG. 2b has a pair of deflection prisms 210a, 210b movable relative to each other. The polarization manipulator 200 thus produces a variably adjustable change in the polarization state for impinging light.

The polarization rotators 210 as shown in FIG. 2a are arranged along the circumference of a circle, through the center point of which the optical axis OA of the illumination system extends. The deflection prisms 210a, 210b are each made of optically active crystalline quartz. The optical crystal axis, as indicated by the double-headed arrows shown vertically in FIG. 2b, extends parallel to the optical axis OA of the illumination system. Relative displacement of the deflection prisms which respectively belong to a pair, in a radial direction relative to the optical axis OA (double-headed arrow P in FIG. 2b), makes it possible to adjust the total thickness of the pair in the direction of the optical axis OA and therewith the rotational angle of the polarization rotator 210. As is diagrammatically indicated in FIG. 2a by the double-headed arrows, it is possible by the polarization manipulator 200 to effect for example setting of an at least approximately tangential polarization distribution, with respect to which the preferred polarization direction is respectively oriented at least approximately perpendicularly to the radius directed towards the optical axis OA.

As shown in FIG. 2b a relative displacement of the deflection prisms 210a, 210b, which takes place in a radial direction (as indicated by the double-headed arrow P) relative to each other causes however an unwanted beam shift with respect to the beams passing through the two deflection prisms 210a, 210b, as the (air) gap between the two deflection prisms 210a, 210b becomes greater with increasing relative displacement.

The mirror arrangement 300 can be used to correct the beam shift by re-adjusting one or more micromirrors, making use of the fact that beam angles on the mirror arrangement 300 respectively correspond to a location in the pupil plane PP in which the deflection prisms 210a, 210b of the polarization manipulator 200 are disposed.

Figure 3:
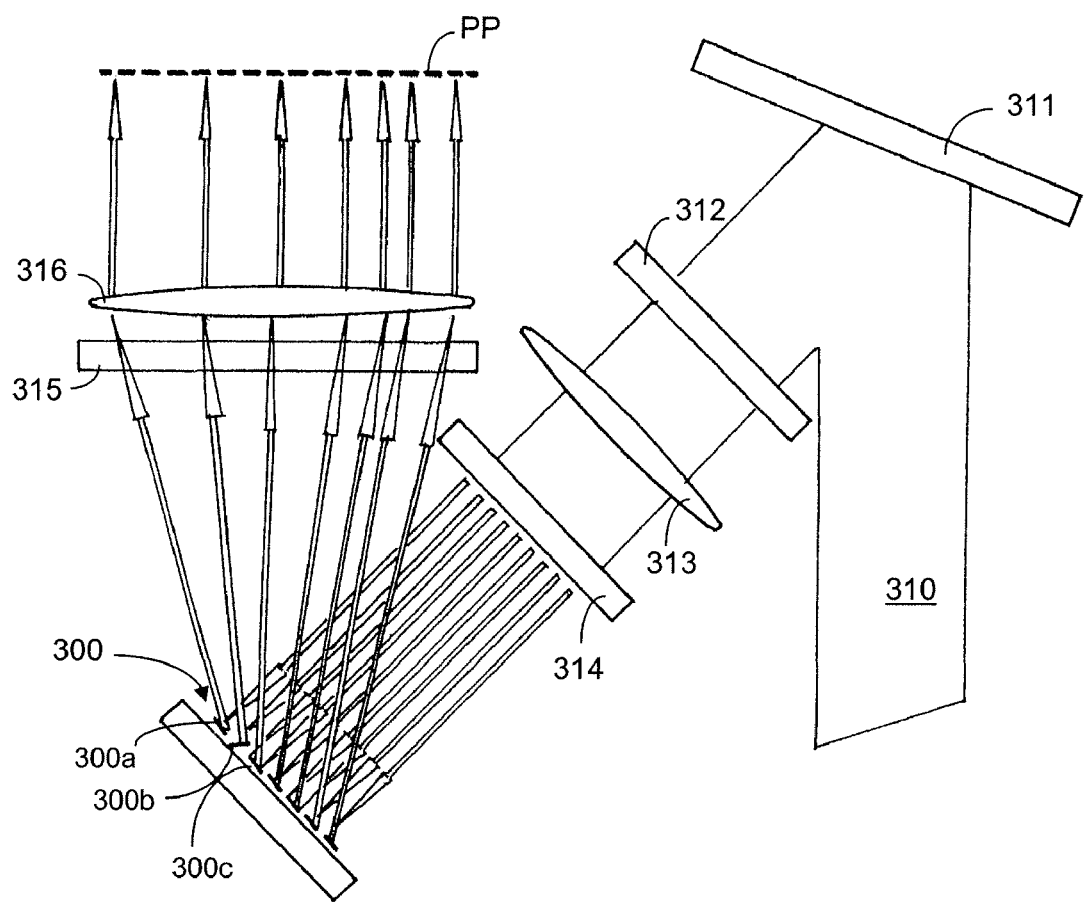
FIG. 3 shows views to describe the structure of a mirror arrangement.

FIG. 3 shows a portion of an illumination system which, in the beam path of a laser beam 310, successively includes a deflection mirror 311, a refractive optical element (ROE) 312, a lens 313 (only shown by way of example), a microlens arrangement 314, the mirror arrangement 300, a diffuser 315, a lens 316 and the pupil plane PP. The mirror arrangement 300 includes a plurality of micromirrors 300a, 300b, 300c, . . . , and the microlens arrangement 314 has a plurality of microlenses for specific targeted focusing onto those micromirrors and for reducing or avoiding illumination of "dead area". The micromirrors 300a, 300b, 300c, . . . can be respectively tilted individually for example in an angular range of between −10° and +10° (e.g., between −5° and +5°, between −2° and +2°).

Besides the correction of an unwanted beam shift, described hereinbefore with reference to FIG. 2b, a given tilt arrangement of the micromirrors 300a, 300b, 300c, . . . in the mirror arrangement 300 also makes it possible to form in the pupil plane PP a desired light distribution, for example the annular illumination setting already referred to in connection with FIG. 5 or also a dipole setting or a quadrupole setting, insofar as previously homogenized and collimated laser light is respectively deflected in the appropriate direction depending on the respectively desired illumination setting, by the micromirrors 300a, 300b, 300c, . . . .

Figure 4:
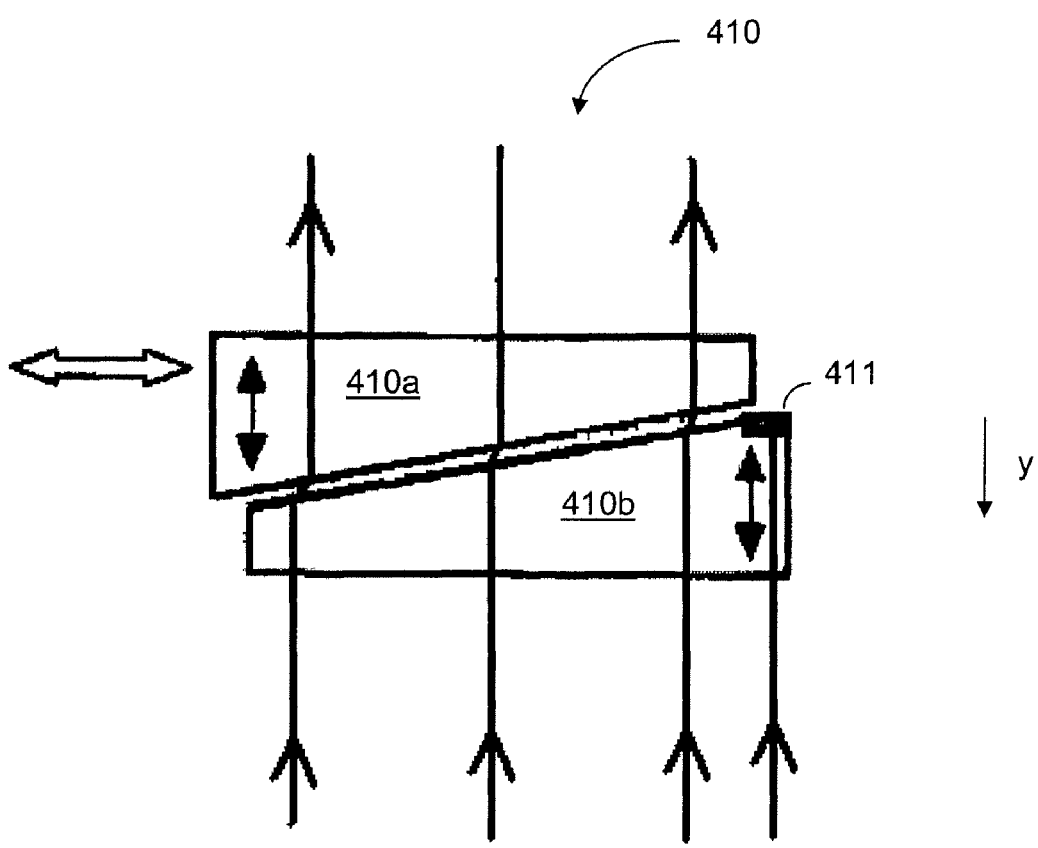
FIG. 4 shows a view to describe the structure of polarization rotators which can be used in the polarization manipulator of FIG. 2, FIGS. 5-6 show views of a microlithographic projection exposure apparatus with an illumination system.

Referring to FIG. 4, shown therein is a configuration, similar to FIG. 2b, of polarization rotators 410 which can be used in the polarization manipulator 200 and which include deflection prisms 410a, 410b, wherein the deflection prism 410b has an opaque region 411. The opaque region 411 can be embodied by the provision of a screening shield at the appropriate location, or it is possible to form a blackened region provided by a coating for example of chromium (Cr). The opaque region 411 is in that zone in which the light only passes through one of the two deflection prisms 410a, 410b (the deflection prism 410b in FIG. 4) so that there would also not be partial compensation of beam deflection for that light by the respective other deflection prism (the deflection prism 410a in FIG. 4).

As a consequence of the opaque region 411 the corresponding pupil region is admittedly not used in the exposure process, but the occurrence of unwanted scatter light in that region is also prevented. Such scatter light is indicated in FIG. 2b by the beam portion which is shown at the right and which passes only through the deflection prism 210b and which is thus laterally deflected without compensation by the deflection prism 210a and, with the structure which is shown in FIG. 4 and which can be adopted for one or all of the polarization rotators 410 of the polarization manipulator 200, can be partially or completely prevented depending on the respective relative setting of the deflection prisms 410a, 410b.

Figure 7A:
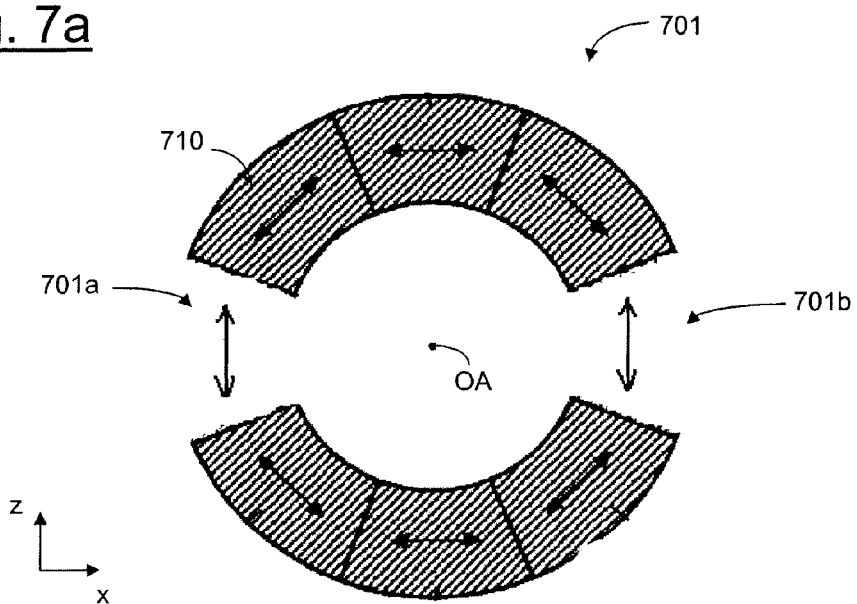
FIGS. 7a-c show a polarization manipulator used in the illumination system of FIG. 1, FIGS. 8a-d show diagrammatic views to describe the structure of a polarization manipulator used in the illumination system of FIG. 1, FIGS. 9-11 show a polarization manipulator used in the illumination system of FIG. 1, FIGS. 12a-b show diagrammatic views to describe the structure of a further arrangement for influencing the polarization state, which can be used in the illumination system of FIG. 1, and FIGS. 13a-e show typical illumination settings which can be adjusted by a mirror arrangement.
Figure 7B:
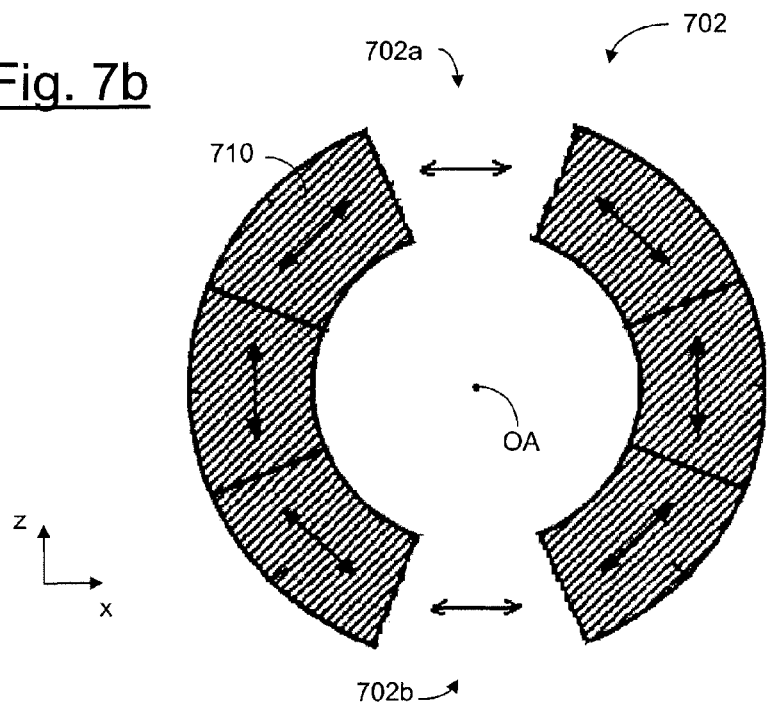
Figure 7C:
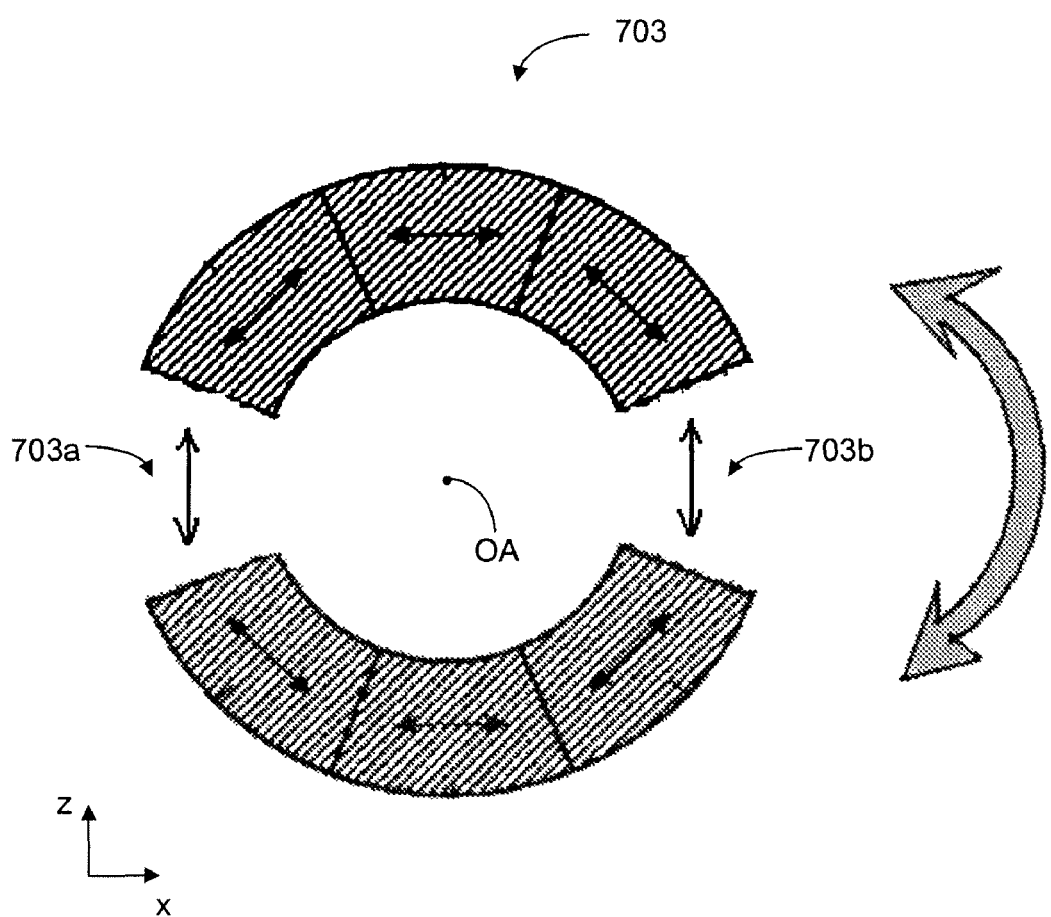

Reference is made to FIGS. 7a-c to describe polarization manipulators 701-703 which can be used in place of the polarization manipulator 200. A common feature to those polarization manipulators 701-703 is that at least two polarization rotators which are disposed in mutually opposite relationship in the polarization manipulator 200 in FIG. 2a are omitted, thereby advantageously taking account, in such a fashion as to save on material, of the fact that no change in the preferred polarization direction of incident light polarized in the x- and z-directions respectively occurs in the regions in question for setting a quasi-tangential polarization distribution.

More specifically the polarization manipulator 701 shown in FIG. 7a has two regions 701a and 701b which are in mutually opposite relationship in the x-direction and in each of which there is not one of the polarization rotators 710 and which are in the form of empty regions or regions free of crystal material. Similarly the polarization manipulator 702 shown in FIG. 7b has two regions 702a and 702b which are in mutually opposite relationship in the z-direction and in each of which there is not one of the polarization rotators 710 and which are in the form of empty regions or regions free of crystal material.

The polarization manipulator 703 shown in FIG. 7c is arranged rotatably about the optical axis OA (as indicated by the double-headed arrow shown at the right in FIG. 7c), and it also has two mutually opposite regions 703a and 703b in which there is not one of the polarization rotators 710 and which are in the form of empty regions or regions free of crystal material, and, as a consequence of the rotatability, can be flexibly adjusted and can be moved both into the position shown in FIG. 7a and also the position shown in FIG. 7b.

Hereinafter a configuration of the phase manipulator 800 of FIG. 1 is described with reference to FIGS. 8a-d. That phase manipulator 800 includes a plurality of Babinet compensators 810 which, as shown in FIG. 8c, are constructed in per se known manner from mutually displaceable wedge elements 810a and 810b of optically uniaxial crystal material, for example magnesium fluoride ($MgF_2$) or crystalline quartz, and with crystal axes ca-2 and ca-3 respectively which are orthogonal relative to each other.

Figure 8B:
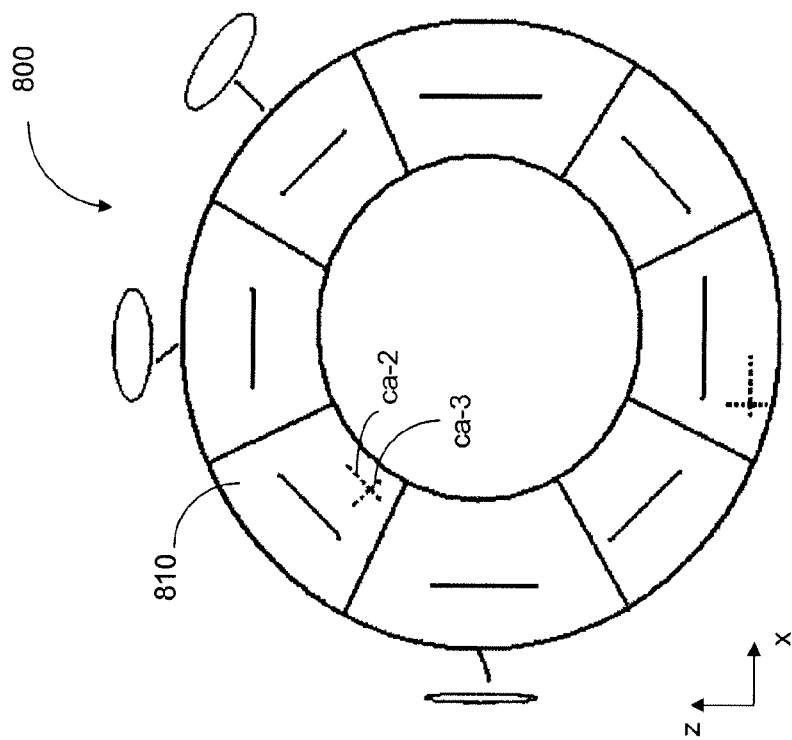
Figure 8A:
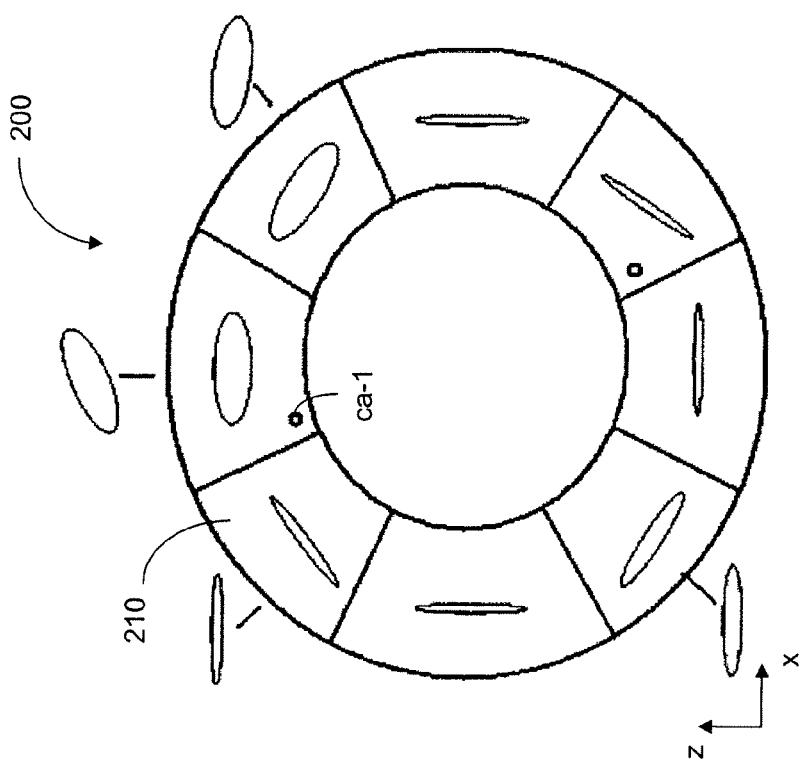
Figure 8C:
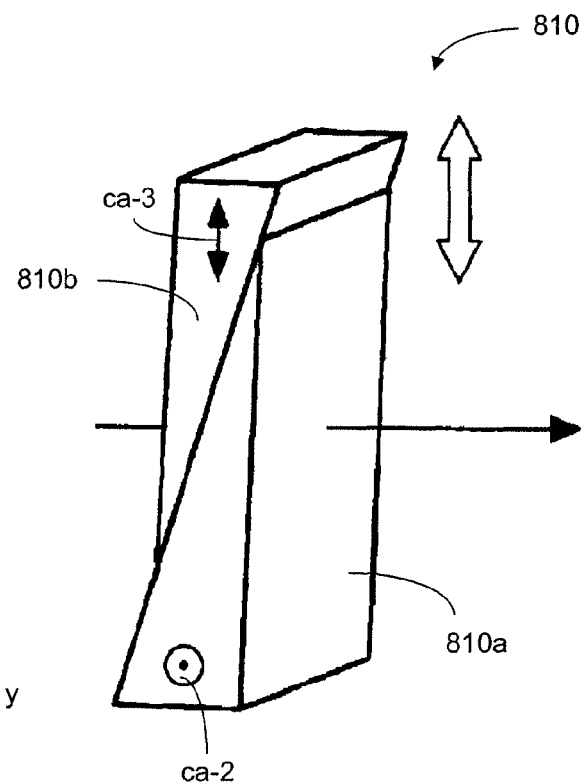
Figure 8D:
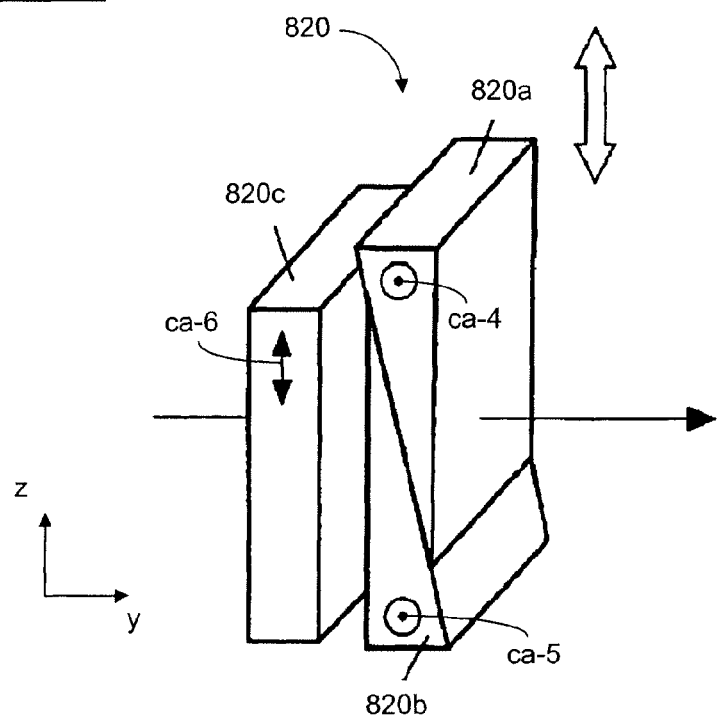

The phase manipulator 800 of FIG. 8d includes a plurality of Soleil compensators 820 which are each made up in per se known manner of mutually displaceable wedge elements 820a and 820b including optically uniaxial crystal material (for example magnesium fluoride ($MgF_2$) or crystalline quartz) and with crystal axes ca-4 and ca-5 respectively which are parallel to each other and perpendicular to the light propagation direction, as well as a plane plate 820c including optically uniaxial crystal material with a crystal axis ca-6 perpendicular to the crystal axes ca-4 and ca-5 and to the light propagation direction.

In some embodiments, a polarization manipulator 200 having the properties already described hereinbefore is now disposed upstream of the phase manipulator 800 in the light propagation direction. Consequently by relative displacement of the deflection prisms 210a, 210b of the polarization rotators 210 in a radial direction relative to the optical axis OA, it is possible to effect specific targeted rotation of the preferred polarization direction and thus a respectively desired setting of the preferred polarization direction relative to the crystal axes ca-2 and ca-3 of FIG. 8c and relative to the crystal axes ca-4, ca-5 and ca-6 in FIG. 8d, without the Babinet compensators 810 or the Soleil compensators 820 themselves arranged rotatably for that purpose. Accordingly, in the described arrangement including the polarization manipulator 200 and the phase manipulator 800 it is only necessary for the thickness of the Babinet compensators 810 or the Soleil compensators 820 to be appropriately adjusted after suitable setting of the polarization rotators 210 in order to produce approximately linearly polarized light from elliptically polarized light. That is shown in FIGS. 8a and 8b, which each indicate outside the polarization manipulator 200 and the phase manipulator 800 the state with respect to polarization direction and ellipticity upstream of the element 200 and 800 in question and in the individual segments of the element the respective state prevailing downstream of the element 200 and 800 respectively in question.

In the above-described configuration it is once again possible, by virtue of the possible elimination of rotatability of the Babinet compensators 810 and the Soleil compensators 820 respectively, to achieve a geometry in the form of segments of a circle with respect to the Babinet compensators 810 and Soleil compensators 820 and thus complete pupil filling by the phase manipulator 800 (with the avoidance of uninfluenced intermediate spaces). The Babinet compensators 810 and Soleil compensators 820 respectively can each all be of an identical structure.

A further advantage of the arrangement described with reference to FIGS. 8a-b of the polarization manipulator 200 and the phase manipulator 800 is that the desired polarization distribution (for example tangential polarization distribution as in FIG. 8b) is afforded downstream of that arrangement in the light propagation direction.

The described advantages arise out of interchanging the sequence of the arrangement of the polarization manipulator 200 and the phase manipulator 800 in relation to the structure known from US No 2007/0146676 A1, more specifically insofar, as described hereinbefore with reference to FIGS. 8a-b, the situation firstly involves rotation of the polarization direction, utilizing the optical activity of the polarization manipulator 200', and only then providing for adjustment of the phase, using linear birefringence.

Modifications of the polarization manipulator which is shown in FIGS. 2a-b and which is known as such from US 2007/0146676 A1 are described hereinafter with reference to FIGS. 9 through 12.

Those configurations are based on the realization that the problems already described with reference to FIG. 2b and FIG. 4, of the beam shift introduced by the polarization manipulator 200, basically cause a comparatively large wedge angle for the deflection prisms 210a, 210b and 410a, 410b respectively to appear desirable in order to achieve significant polarization manipulation with just a slight relative displacement of the deflection prisms 410a, 410b relative to each other and thus with corresponding limitation of the beam shift. Such a comparatively large wedge angle for the deflection prisms 210a, 210b and 410a, 410b however undesirably results in a level of temperature sensitivity with respect to the polarization action achieved, which is greater in comparison with a polarization manipulator having smaller wedge angles for the deflection prisms 210a, 210b and 410a, 410b respectively.

If for example the starting point adopted is a radial extent of the deflection prisms of 20 millimeters (mm) (corresponding to a third of a typical pupil radius of 60 mm) and if an optical activity of crystalline quartz with a specific rotational capability of about 324°/mm at a wavelength of 193 nm is taken as a basis, then with a wedge angle of 280 mrad (approximately corresponding to 16°) to achieve a change in thickness of ±280 μm and thus a rotational angle of ±90° a maximum wedge thickness of 5 mm is achieved. With a temperature dependency of optical activity of crystalline quartz of 2.4 mrad/(mm*° C.), that means that a change in temperature by 2° C. results in a maximum change in the rotation of polarization through an angle of about 1.4°.

Figure 9:
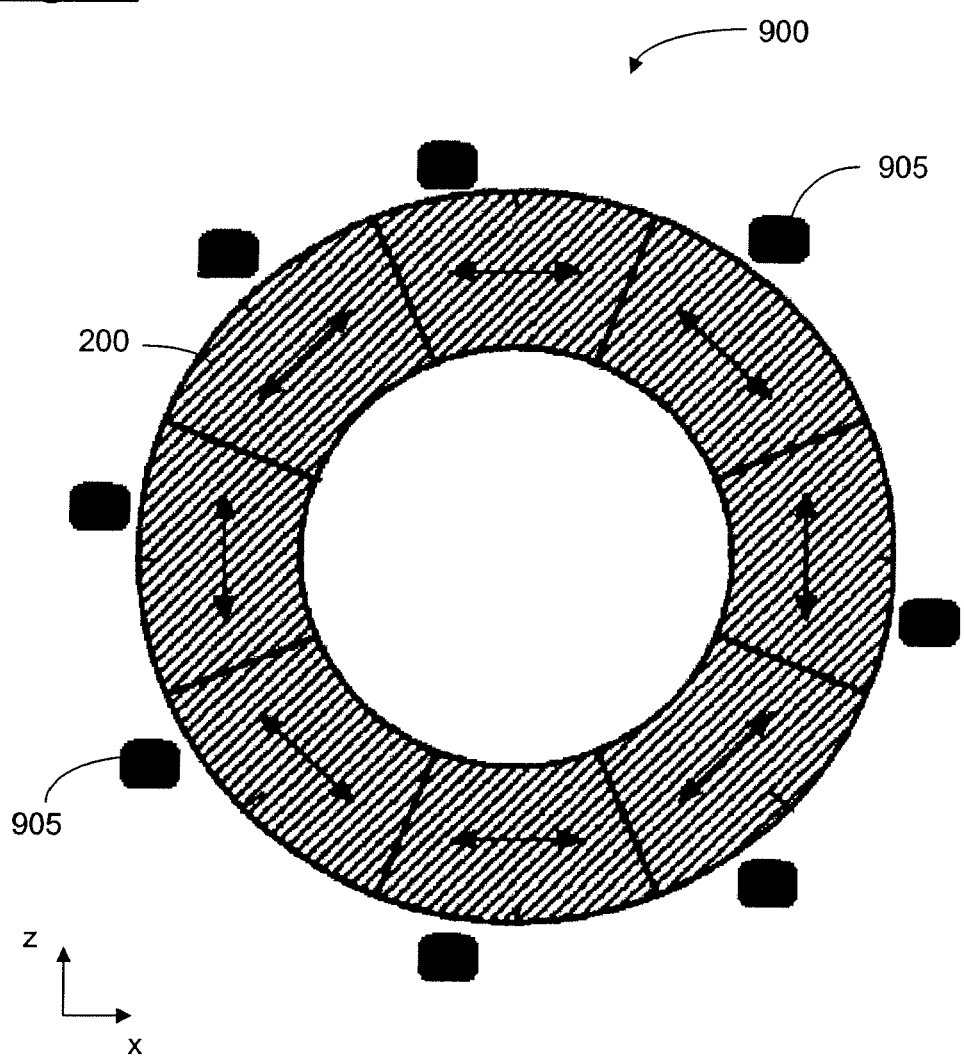

FIG. 9 shows a configuration of the polarization manipulator for overcoming that problem. In that respect associated with the individual polarization rotators 210 are respective temperature sensors 905 which in turn are coupled to the displacement device used for altering the relative position of the deflection prisms 210a, 210b of the polarization rotators 210. In that way a change in temperature registered by the temperature sensors 905 and a change in the polarization rotation afforded by the polarization manipulator, such change being related to that change in temperature, can be partially or completely compensated by way of the displacement device.

Figure 10:
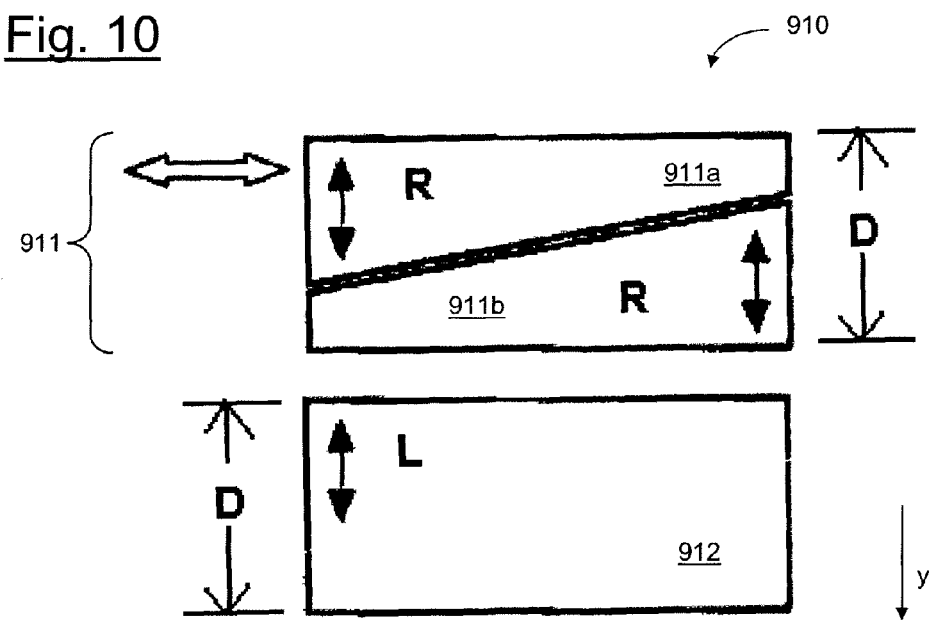
Figure 11:
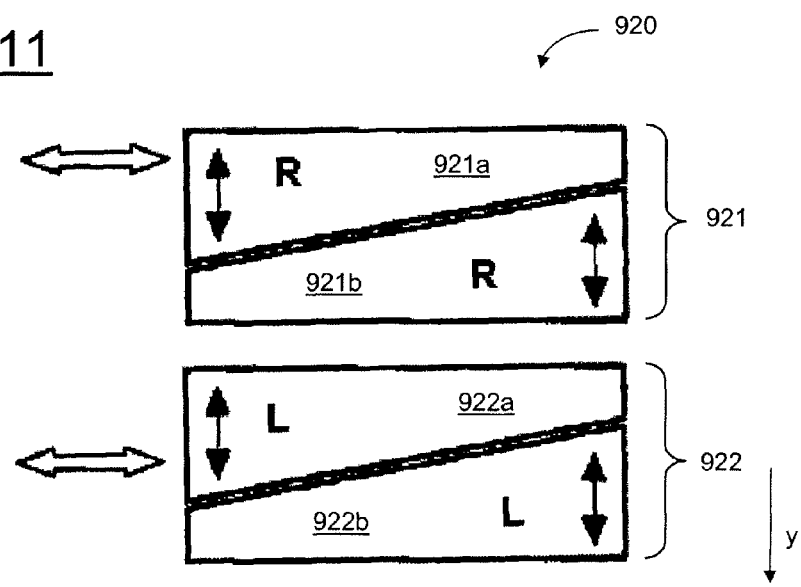

Reference is now made to FIG. 10 and FIG. 11 to describe further configurations of a polarization manipulator for overcoming the problem of a temperature dependency of the rotation of polarization, caused by the polarization manipulator. Those configurations have the common aspect that a reduction in or complete elimination of the temperature dependency is achieved by the simultaneous use of dextrorotatory and levorotatory optically active material. Embodiments of levorotatory and dextrorotatory quartz (referred to as "optical isomers" or "enantiomers") admittedly contain, as is known, identical molecules ($SiO_2$), but in a mirror-image arrangement, and can be specifically produced by suitable choice of the seed crystals.

Referring to FIG. 10 a polarization manipulator 910 includes on the one hand the arrangement, already described with reference to FIGS. 2a-b, of polarization rotators 911 which are each made up of deflection prisms 911a, 911b of optically active crystalline quartz which in the illustrated example are dextrorotatory, and in addition a plane plate 912 of optically active material of opposite direction of rotation, in this example being levorotatory crystalline quartz, and of a thickness D which is the same as the thickness of the polarization rotators in the arrangement shown in FIG. 10. In this case the plane plate 912 extends over the same region of the light beam cross-section as the polarization rotators 911 and is therefore of an annular geometry, corresponding to the structure described with reference to FIG. 2a.

As a consequence of the opposite temperature variation with respect to rotation of the polarization in the plane plate 912 in comparison with the rotation of the polarization in the deflection prisms 911a, 911b, it is possible to achieve compensation of the above-described temperature influence. If for example in the arrangement of FIG. 10 the deflection prisms 911a, 911b formed from dextrorotatory quartz, as a consequence of a change in temperature in the environment, rotate the orientation of the polarization of light incident perpendicularly on the plate surface excessively far by 2 mrad (measured at the total thickness D of the polarization rotator 911), that effect is compensated by the plane plate 912 of levorotatory quartz, as a consequence of the same change in temperature, rotating the orientation of the polarization of the same light excessively little by 2 mrad (in relation to the thickness thereof) so that the temperature effects compensate each other or cancel each other out.

As shown in FIG. 11, instead of the plane plate 911 it is also possible to use a further unit 922 which is composed of deflection prisms 922a, 922b of levorotatory quartz and which is thus also of a thickness variable relative to each other by relative displacement of the deflection prisms 922a, 922b. If the spacing of the respectively complimentary deflection prisms 921a and 921b, 922a and 922b respectively, that is to say the (air) gap remaining between those deflection prisms, is set to be precisely equal, a beam shift compensation effect can also be achieved over and above the above-described temperature compensation action.

Figure 12A:
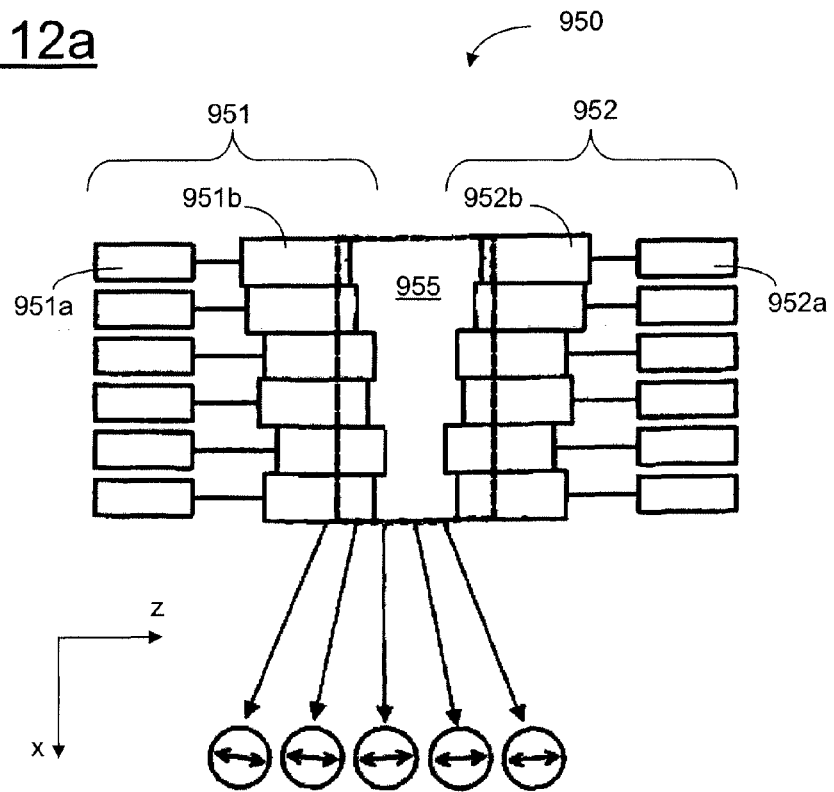
Figure 12B:
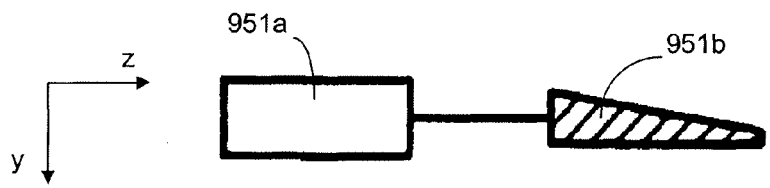

A further advantageous configuration of the illumination system of FIG. 1 is described hereinafter with reference to FIGS. 12a-b. FIG. 12a is a diagrammatic plan view showing an arrangement 950 of wedge plates 951b, 952b with respectively associated drive units 951a and 952a respectively (see the side view in FIG. 1), by way of which the wedge plates 951b, 952b arranged in two rows 951 and 952 of substantially the same structural configuration can be introduced equally far from mutually opposite sides of an illuminated field region 955, into that illuminated field region 955. The displaceability or mobility of the wedge plates 951b, 952b is effected in parallel relationship with the scan direction (extending in the z-direction).

A projection exposure apparatus with an illumination system having an arrangement of wedge plates which corresponds to a single row 951 in FIG. 12a is described for use at the position shown in broken line in FIG. 1, that is to say immediately upstream of the aperture unit 112 in the light propagation direction and for the purposes of altering the polarization state of the light beams incident on the wafer plane, in above-mentioned US No 2007/0146676 A1.

Now, in a modification of that known arrangement, the configuration illustrated in FIG. 12a, in the form of an arrangement, symmetrical about the field center, including two rows 951 and 952 of the same structural configuration, is advantageous in terms of correct imaging insofar as it is possible to avoid side-effects by virtue of transmission losses at the wedge plates 951b, 952b and telecentry errors resulting therefrom.

In some embodiments, the wedge plates 951b, 952b, in a modification of FIG. 12a, can also be moved inclinedly (that is to say not parallel) relative to the scan direction into the illuminated field region 955. That has the advantage that edges of the wedge plates 951b, 952b do not involve significant shading effects in the scanned intensity distribution.

The possibility of setting an annular light distribution in the pupil plane by the mirror arrangement 300 has already been mentioned in relation to FIG. 5. Besides such an annular light distribution (identified by 981 in FIG. 13a) FIGS. 13a-e show typical further illumination settings which can be set by the mirror arrangement 300, wherein FIG. 13b shows a quadrupole illumination setting 982 also referred to as "C-quad" setting, FIGS. 13c and 13d show dipole illumination settings 983 and 984 with illumination poles in mutually opposite relationship in different directions and FIG. 13e shows an illumination setting referred to as a "quasar" setting, in which the four poles of the quadrupole are arranged rotated about the optical axis in each case through 45° relative to the "C-quad" setting of FIG. 13b.

Even if the disclosure has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present disclosure and the scope of the disclosure is limited only in the sense of the accompanying claims and equivalents thereof.

What is claimed is:

1. An illumination system, comprising:
    a polarization manipulator configured to variably adjust a change in polarization state of light impinging thereon; and
    a mirror arrangement comprising a plurality of mirror elements displaceable independently of each other to alter an angle distribution of the light reflected by the mirror arrangement,
    wherein:
    the illumination system is configured to be used in a microlithographic projection exposure apparatus,
    a change in intensity distribution of the light caused by the polarization manipulator in a plane of the projection exposure apparatus can be at least partially compensated by the mirror arrangement, and
    the mirror arrangement is upstream of the polarization manipulator in a path of the light through the illumination system.

2. The illumination system as set forth in claim 1, further comprising a microlens arrangement comprising a plurality of microlenses.

3. The illumination system as set forth in claim 1, further comprising an intensity measuring device to measure the intensity distribution of the light in the plane of the projection exposure apparatus.

4. The illumination system as set forth in claim 3, further comprising a temperature measuring device to measure temperature at the polarization manipulator.

5. The illumination system as set forth in claim 4, further comprising a control device to actuate the mirror arrangement depending on an output signal of the intensity measuring device and/or the temperature measuring device.

6. The illumination system as set forth in claim 1, wherein the plurality of mirror elements are displaceable in an angle range of between −10° and +10°.

7. The illumination system as set forth in claim 1, wherein at least one of the following illumination settings is adjustable by the mirror arrangement: a) a quadrupole illumination setting; b) a dipole illumination setting; c) and an annular illumination setting.

8. The illumination system as set forth in claim 1, wherein the mirror arrangement is configured so that it alone produces an annular intensity distribution.

9. The illumination system as set forth in claim 1, wherein the polarization manipulator is in a pupil plane of the illumination system.

10. The illumination system as set forth in claim 1, wherein the polarization manipulator comprises at least two subelements arranged movably relative to each other.

11. The illumination system as set forth in claim 1, wherein the polarization manipulator comprises a plurality of polarization rotators configured to cause a rotation of the polarization direction of the light through a variably adjustable rotational angle.

12. The illumination system as set forth in claim 11, wherein each of the plurality of polarization rotators comprises a pair of deflection prisms movable relative to each other.

13. The illumination system as set forth in claim 11, wherein the polarization rotators are arranged along the circumference of a circle, and an optical axis of the illumination system extends through a center point of the circle.

14. The illumination system as set forth in claim 13, wherein the polarization rotators are interrupted along the circumference of the circle in at least two mutually opposite regions in which none of the polarization rotators is disposed.

15. The illumination system as set forth in claim 10, wherein the at least two subelements comprise optically active material.

16. The illumination system as set forth in claim 1, wherein the polarization manipulator includes levorotatory optically active material and dextrorotatory optically active material.

17. The illumination system as set forth in claim 10, wherein at least one of the at least two subelements has an opaque edge region on a light entrance surface and/or on a light exit surface.

18. The illumination system as set forth in claim 1, further comprising a phase manipulator.

19. The illumination system as set forth in claim 18, wherein the polarization manipulator is upstream of the phase manipulator in a light propagation direction.

20. An apparatus, comprising:
an illumination system as recited in claim 1; and
a projection objective,
wherein the apparatus is a microlithography projection exposure apparatus.

\* \* \* \* \*

UNITED STATES PATENT AND TRADEMARK OFFICE
CERTIFICATE OF CORRECTION

Figure 13:
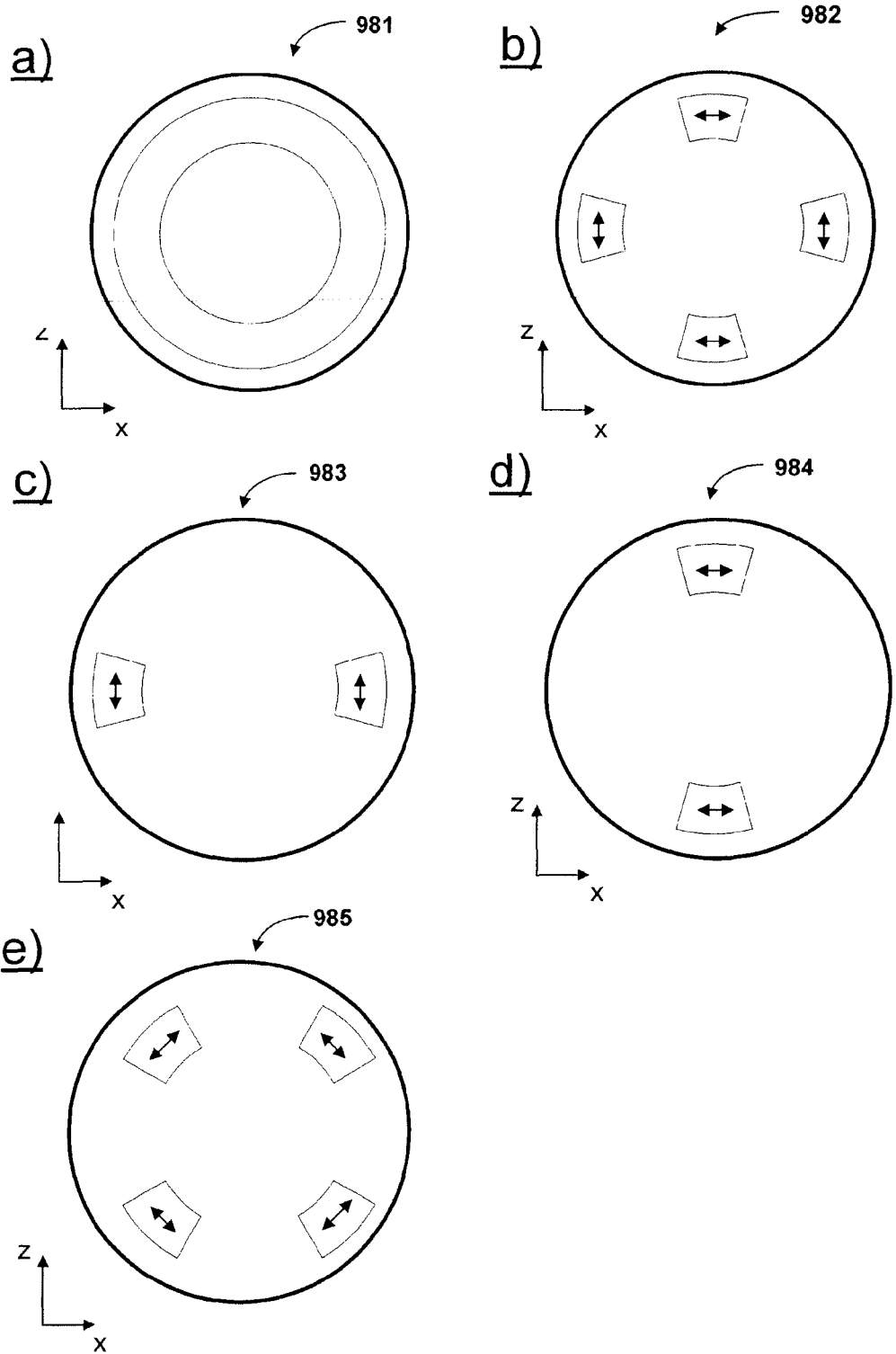

PATENT NO. : 8,040,492 B2  Page 1 of 1
APPLICATION NO. : 12/270994
DATED : October 18, 2011
INVENTOR(S) : Damian Fiolka It is certified that error appears in the above-identified patent and that said Letters Patent is hereby corrected as shown below:

Sheet 14 of 14, FIG. 13, reference 981, delete " 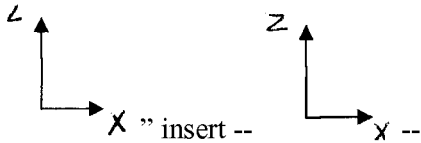 " insert --

Sheet 14 of 14, FIG. 13, reference 983, delete " 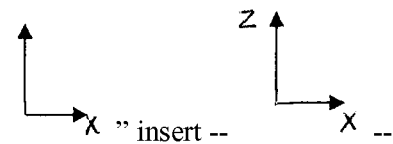 " insert --

Column 3, Line 4, delete "sub element)." insert --subelement).--

Column 4, Line 59, delete "300c," insert --300c,...--

Signed and Sealed this
Twentieth Day of December, 2011

David J. Kappos
*Director of the United States Patent and Trademark Office*